United States Patent [19]

Simko

[11] Patent Number: 5,126,967
[45] Date of Patent: Jun. 30, 1992

[54] WRITABLE DISTRIBUTED NON-VOLATILE ANALOG REFERENCE SYSTEM AND METHOD FOR ANALOG SIGNAL RECORDING AND PLAYBACK

[75] Inventor: Richard Simko, Los Altos, Calif.

[73] Assignee: Information Storage Devices, Inc., Santa Clara, Calif.

[21] Appl. No.: 589,173

[22] Filed: Sep. 26, 1990

[51] Int. Cl.$^5$ .............................................. G11C 27/02
[52] U.S. Cl. .................................. 365/45; 365/189.09
[58] Field of Search ................... 365/45, 210, 189.09

[56] References Cited

U.S. PATENT DOCUMENTS

| | | | |
|---|---|---|---|
| 3,938,108 | 2/1976 | Salsbury et al. | 365/104 |
| 3,984,822 | 10/1976 | Simko et al. | 365/185 |
| 4,054,864 | 10/1977 | Audaire et al. | 365/45 |
| 4,099,196 | 7/1978 | Simko | 357/23 |
| 4,119,995 | 10/1978 | Simko | 357/23 |
| 4,181,980 | 1/1980 | McCoy | 365/45 |
| 4,314,265 | 2/1982 | Simko | 357/23 |
| 4,318,188 | 3/1982 | Hoffmann | 365/45 |
| 4,533,846 | 8/1985 | Simko | 307/550 |
| 4,627,027 | 12/1986 | Rai et al. | 365/45 |
| 4,701,776 | 10/1987 | Perlegos et al. | 357/23.5 |
| 4,890,259 | 12/1989 | Simko | 365/45 |

OTHER PUBLICATIONS

"A 1mV MOS Comparator" by Yen S. Yee, Lewis M. Terman, Lawrence G. Heller, IEEE Journal, Solid State Circuits, vol. SC-13, pp. 294-298, Jun. 1978.
1982 ISSCC Digest of Technical Papers re "A 16K E2PROM" by National Semiconductor Corp., p. 108.
"A 25ns 16K CMOS PROM Using a 4-Transistor Cell" (1985 ISSCC Digest of Technical Papers, pp. 162-163).
1989 ISSCC Digest of Technical Papers re "A 5V-Only 256k Bit CMOS Flash EEPROM" by Texas Instruments Inc.

Primary Examiner—Joseph A. Popek
Attorney, Agent, or Firm—Blakely Sokoloff Taylor & Zafman

[57] ABSTRACT

A writable distributed non-volatile analog reference system and method for analog signal recording and playback having application in integrated circuits which sample and directly store analog information. The invention is useful to facilitate the sensing of analog levels stored in nonvolatile memory cells where the analog levels are played back such as to reproduce voice or music or tone information. In accordance with the method, one or more reference storage columns are included in the array at each side of the storage cell array and are used to store a reference signal at the same time that the adjacent storage cell stores a signal sample. On playback, the stored reference signals for the row of the array are read back and weighted relative to each other in accordance with the relative row position of the signal storage cell being simultaneously read, with the output signal being taken as the difference between the signal sample read back and the reference signals read back (as weighted relative to each other as per the position in the row of the signal cell). This differencing places many error sources in the common mode, thereby substantially eliminating the same from the output signal. A specific memory array organization and the operation thereof is disclosed.

8 Claims, 3 Drawing Sheets

WRITABLE DISTRIBUTED NON-VOLATILE ANALOG REFERENCE SYSTEM AND METHOD FOR ANALOG SIGNAL RECORDING AND PLAYBACK

BACKGROUND OF THE INVENTION

1. Field of the Invention

The present invention relates to the field of integrated circuit analog storage devices.

2. Prior Art

Analog recording apparatus such as described in the U.S. Pat. No. 4,890,259 incorporates a dual plurality of sample and hold circuits. This architecture was developed to create the time intervals required to sequence through the analog recording operation, which in turn requires iterating through a series of perhaps hundreds of high voltage writing and comparing steps. As a result of the use of the pluralities of sample and hold circuits with. for example, 100 sample and hold nodes where each node is loaded at a different time, a practical problem results. The problem is that the voltage stored at each sample and hold node has a different amount of time to discharge before being stored into the nonvolatile array. As each node experiences leakage currents, each node will discharge a different amount before its voltage value is stored into the array. This distributed leakage action will result in an undesirable "sawtooth" voltage profile superimposed on the stored analog signal upon playback. For a voice playback, for example, there would be a loud buzz incorporated into the sound.

The amount of leakage is also strongly temperature dependant, as is known in the art. Such leakage currents double in magnitude roughly every 8 to 9 degrees Centigrade increase in temperature. In addition to the special requirements described above, the sensing system should also satisfy other requirements. For instance, the reference system should "reject" or put into the "common mode", temperature variations as those variations effect the storage cells. If voice information is recorded at a high temperature and played back at a lower temperature, the voice should not sound any different than the original recording. Similarly, to the extent that internal bias voltages which facilitate the array operation change with changes of the power supply voltages, such changes which also effect the behavior of the storage cells should not place any spurious information in the recorded information stream. This concept is known in the art as "power supply rejection." In short, the reference system must place into the common mode the thermal and power supply effects. Other factors which must be placed into the "common mode" and "rejected" are local variations in the storage cells due to wafer processing misalignment and cell layout orientation differences, as are known in the art.

Reference cells and columns of reference cells are known in the art to reject the affects of cell layout, process misalignment, temperature and power supply variations. In particular, floating gate memory cells are known to be used as references in the case of a digital nonvolatile memory application, as is described in U.S. Pat. No. 3,938,108. Columns of reference cells paralleling columns of memory cells are in effect what is described for a digital memory in the ISSCC paper entitled *A 25ns 16K EPROM USING A 4-TRANSISTOR CELL* (1985 ISSCC Digest of Technical Papers, pp. 162-163). Also in the neural network art, it is known that floating gate devices are "programmed" to provide an analog "weight" value, i.e., an equivalent to a variable resistor.

BRIEF SUMMARY OF THE INVENTION

A unique sensing reference circuit having application in integrated circuits which store analog information such as in nonvolatile integrated circuit audio recording and playback devices of the type disclosed in U.S. Pat. No. 4,890,259. The invention is useful to facilitate the sensing of analog levels stored in nonvolatile memory cells where the analog levels are played back such as to reproduce voice or music or tone information or analog waveforms.

The invention is further useful for implementing a digital memory integrated circuit where the implementation of the digital memory is such that the digital information is encoded as analog information such as voltage levels to be stored on nonvolatile cells in an analog memory array. Such encoding can be done on the memory chip or off the memory chip by a digital to analog converter. The analog levels can be stored in nonvolatile memory cells in accordance with the apparatus described in the U.S. Pat. No. 4,890,259. The digital information is recovered from the analog storage array by presenting the analog levels from the nonvolatile analog storage array to an analog to digital converter and outputting the digital information such as a nibble or byte or other combination of digital information. As is the case with the digital to analog converter, the analog to digital converter also may or may not be fabricated on the same integrated circuit as the nonvolatile analog memory array and analog recording apparatus.

DETAILED DESCRIPTION OF THE INVENTION

Figure 1:
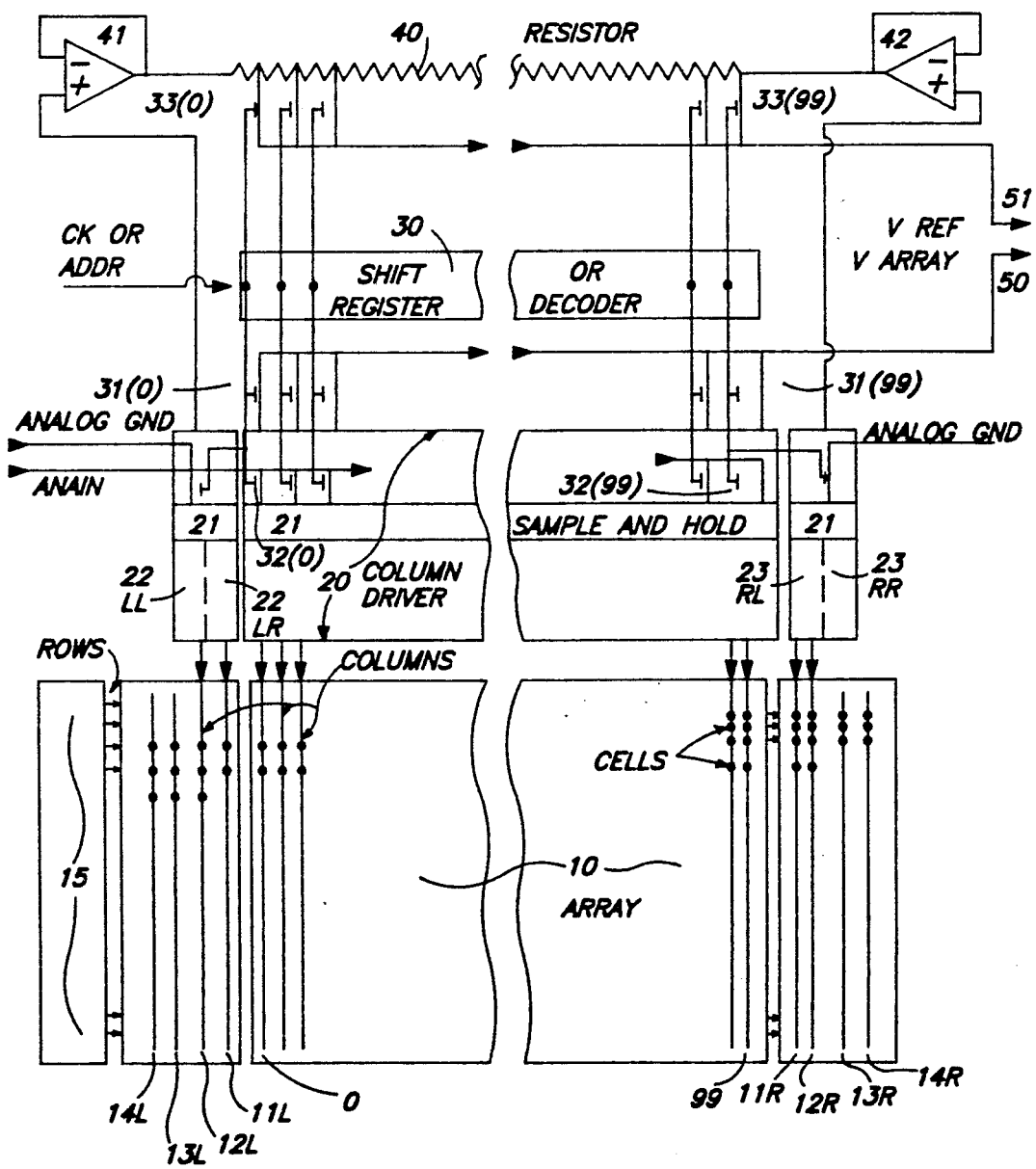
FIG. 1 a schematic layout of one embodiment of the invention is depicted in conjunction with a storage array and certain support circuitry.

Referring first to FIG. 1, a schematic layout of one embodiment of the invention is depicted in conjunction with a storage array and certain support circuitry. The array and associated circuitry is generally consistent with the apparatus described in U.S. Pat. No. 4,890,259, which disclosure is incorporated herein by reference. However as an improvement thereof, the recorded signal is played back not as a single ended signal, but rather as the difference of an array signal and a reference signal. In this manner many undesirable signal components are put into the common mode and are rejected by the differencing circuits.

Nonvolatile analog memory storage array 10 consists of rows and columns of cells such as EEPROM cells. By way of example, the array might contain hundreds of rows and hundreds of columns. Columns 11L and 12L and 11R and 12R are the left and right pairs of reference columns, respectively, disposed adjacent to the memory array. Column pair 11L and 12L and pair 11R and 12R are utilized instead of a single left column and a single right column because of an additional refinement in the reference system. The dual plurality of sample and hold circuits used in an alternating fashion (see U.S. Pat. No. 4,890,259) may have a left handed and a right handed layout orientation. In that case the columns 11L and 11R would be used to record the reference information for one set of sample and hold circuits, and columns 12L and 12R would be used to record the information of the other set of sample and hold circuits. In this manner the details of lefthandedness and righthandedness of the two pluralities are taken into account by the reference system.

Outside (physically to the side) of the reference columns are columns 13L and 14L and 13R and 14R. These columns provide a physical boundary on the outside of the reference columns which mimic the inside boundary formed by the end columns of the memory array proper. In addition to forming a physical boundary, these columns may also be used for other information storage purposes.

Row decoder 15 provides row selection and row bias voltages as is known in the art, and in part controls recording and playback action of both the array and of the reference cells. Array column drivers 20 and reference column drivers 22LL and 22LR and 23RL and 23RR are analog column recording circuits constructed in accordance with U.S. Pat. No. 4,890,259. These circuits, in conjunction with their control timing and bias circuitry (not shown), perform the actual analog recording to the cells. Contained in the column drivers are sample and hold circuits 21 and reference sample and hold circuits. Both array and reference column drivers contain sample and hold circuits 21.

During recording, shift register or alternatively column decoder 30 provides selection of input signal ANAIN to the appropriate column driver in step with the overall chip sampling and timing scheme. During recording, representative gating transistors 32(0) thru 32(99) sequentially gate the ANAIN signal onto the sample and hold circuits 21. The shift register or decoder is driven by a clock CK or by address lines ADDR, respectively, in step with the sampling timing.

Referring now to the reference columns, during recording when gate 32(0) opens to the first array column driver sample and hold, gate 32L simultaneously opens to the left side reference column driver sample and hold. Likewise many samples later, for example, 100 samples later, when gate 32(99) opens, gate 32R also opens simultaneously to the right side reference column driver. In both left and right cases, a predetermined reference voltage called analog ground (ANALOG GRD) of, say, 1.5 volts magnitude loads into the reference sample and hold nodes. These simultaneous gatings force the left reference column driver sample and hold to load simultaneously with the first (left most) array column driver sample and hold. An important result is that both sample and holds simultaneously begin their undesirable leakage discharge due to leakage current. Likewise, the same simultaneous relationship also occurs with the right side reference column and the adjacent array column driver sample and hold 100 samples later (in the embodiment being described).

Thus when the leftside reference sample and hold loaded the 1.5v analog ground level, the leftmost array sample and hold loaded whatever signal value was present on ANAIN, a sample of a voice signal for example. Likewise when the rightside reference sample and hold loaded the 1.5v analog ground level, the rightmost array sample and hold loaded whatever signal was then present on ANAIN.

During playback, gating transistors 31(0) thru 31(99) gate the outputs of the column drivers to the line 50, called Varray. Also during playback, gating transistors 33(0) thru 33(99) gate the voltage value at the corresponding tap point of reference divider resistor 40 to the line 51, called Vref. Followers 41 and 42 provide buffering between the outputs of the reference column drivers and the resistor, and provides required drive to the resistor. The followers are of conventional design as is known in the art. The followers drive voltages to the end nodes of the resistor which voltages are equal to the output voltages of the respective reference columns as transmitted by the reference column drivers. The difference between the array signal Varray and the reference signal Vref is the actual recorded information. This difference signal is processed thru a filter and an amplifier and outputted to a speaker, for example, for voice information as is known in the art.

OPERATION

Figure 2A:
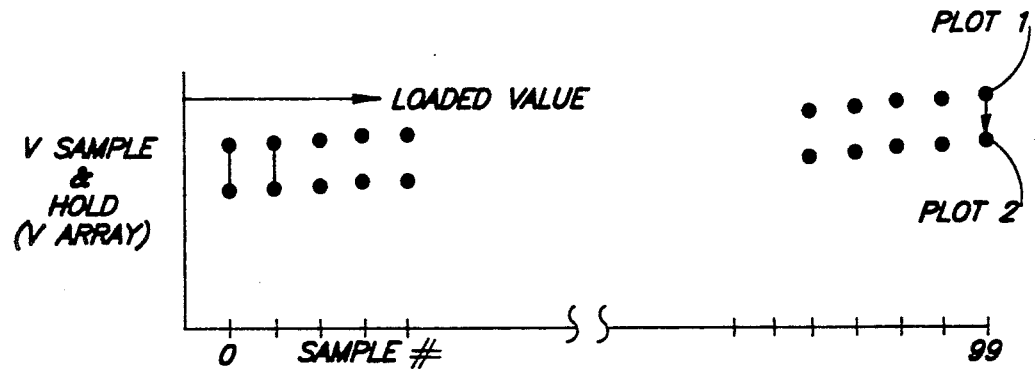
FIG. 2A illustrates typical voltage values in 100 array sample and hold nodes just after loading the last node.

Referring now to FIG. 2A, the operation of the reference system in conjunction with the analog array to record and faithfully reproduce an analog signal recording will now be described. FIG. 2A illustrates typical voltage values in 100 array sample and hold nodes just after loading the last node. This loading time is 12.5 milliseconds in the case of an 8 kilohertz sample rate, by way of example. Also for this explanation, it is assumed for simplicity that the signal that was recorded is simply a single voltage value (a "DC" level) rather than a time varying signal such as a voice signal. It can be seen that the first node (0) has decayed in voltage somewhat compared to the last one (99) which was just loaded and has had no time to decay. The time that expired in loading the samples in the first plurality of sample and hold circuits resulted in the skewed distribution of voltage sample values due to the leakage. The distribution of sampled and held values is shown in FIG. 2A plot 1. Now the operation of the column drivers is such that an equal amount of time must pass to record these samples into the array. (During this time the second plurality of samples is loading the input signal at ANAIN so as not to miss any of the information.) During this equal amount of time, another 12.5 milliseconds, the first sample and hold decays further as shown in FIG. 2A plot 2.

Figure 2B:
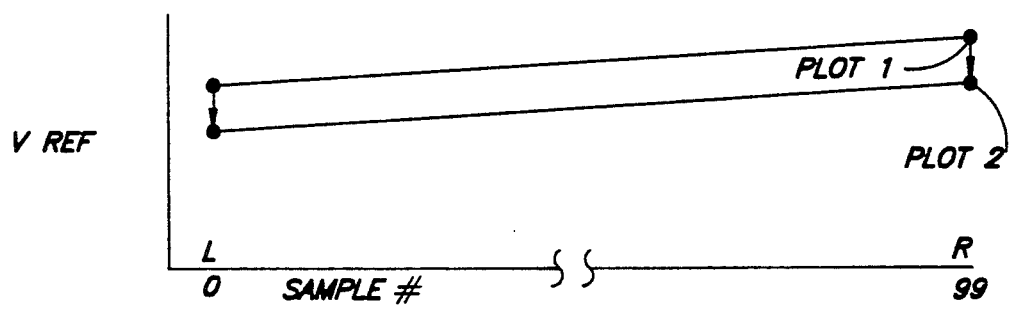
FIG. 2B depicts the decay behavior of the single left side and single right side reference sample and hold levels.
Figure 2C:
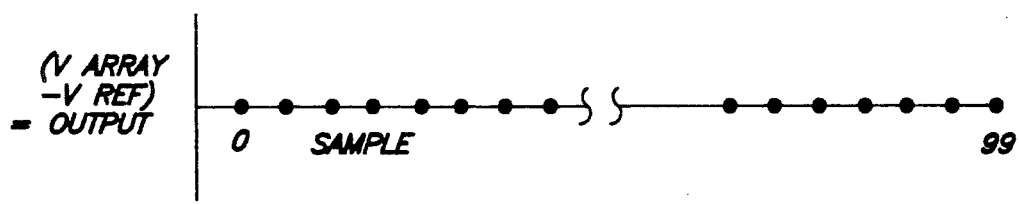
FIG. 2C illustrates the original DC signal as recovered.

FIG. 2B depicts the decay behavior of the single left side and single right side reference sample and hold levels. Note that they mimic the leftmost and rightmost decay behavior of the memory samples in FIG. 2A. The values of Vref which are intermediate to the left and right values are the values taken from the taps on the divider resistor 40. Hence the divider resistor provides a "sliding scale" to provide appropriate values for reference for the individual samples intermediate the left and rightmost samples. It is assumed that the sample and hold values after leakage for the sample and hold circuits intermediate the leftmost and rightmost circuits will be mimicked by the voltage values along the resistor taps. It is now obvious that by subtracting the linearly proportioned values of Vref from the respective values of Varray at the proper times, the original signal will be recovered as shown in FIG. 2C.

Figure 3A:
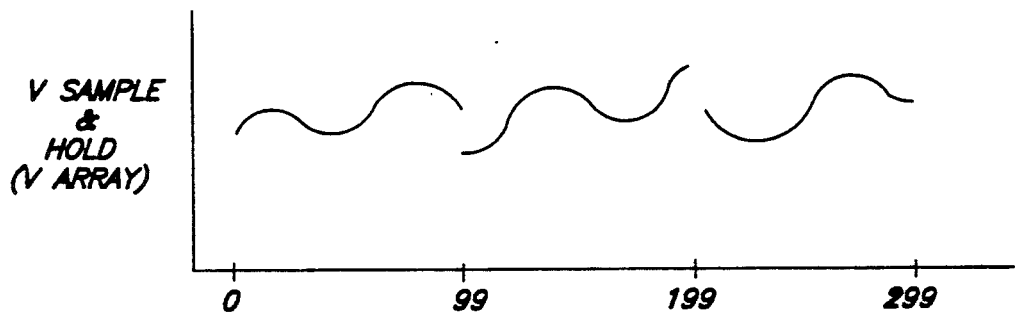
FIG. 3A illustrates the array signal for 3 periods of 100 samples each for a more complex signal recording.
Figure 3B:
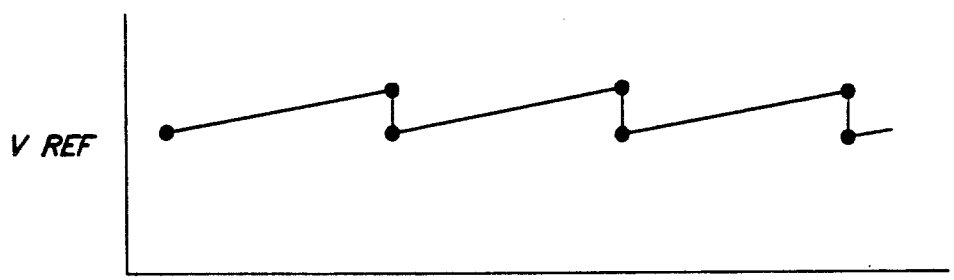
FIGS. 3B illustrates the reference signal for 3 periods of 100 samples each for a more complex signal recording, showing the characteristic "sawtooth" produced by the reference system over multiple periods of 100 samples.
Figure 3C:
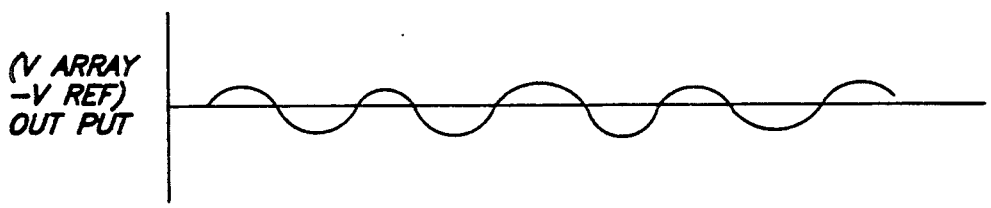
FIG. 3C illustrates the recovered signal after the sawtooth reference signal is subtracted from the array signal to recover the original recording.

Now referring to FIGS. 3A thru 3C, the array signal and reference signal for 3 periods of 100 samples each for a more complex signal recording other than a simple single voltage level may be seen. FIG. 3B shows the characteristic "sawtooth" produced by the reference system over multiple periods of 100 samples. This sawtooth is subtracted from the array signal to recover the original recording as shown in FIG. 3C.

RESULTS

Thus the sawtooth or buzz signal is removed from the recording. Hence the reference has compensated for the sample and hold circuit limitations. In addition, because of the differential architecture of the system other effects. such as bias variations, cell misalignment, layout orientations, and cell thermal effects not related to sample and hold circuitry thermal effects are placed in the common mode and rejected. Included among the advantages of the present invention are the following:

1. Using only a single pair or right side and left side columns or double pairs of right and left side columns save a great deal of layout area compared to a reference system requiring many columns.

2. The reference cells are actually written to or recorded to such that the recorded value is responsive to the sample and hold thermal condition of the chip at the time of recording. Other prior art floating gate references do not record values which contain information corresponding to chip conditions at the time of writing or recording. This is a major difference of this reference system from the prior art. This feature indicates that this is an intelligent reference system, as it is able to compensate for more factors than a conventional passive reference system.

3. The reference system incorporates a tapped resistor divider to deliver a reference signal which represents information components simultaneously being outputted from different reference columns (and necessarily different cells). This is a major feature of this reference system. This feature permits a small chip area to be used to realize the reference system approaching in performance one reference cell per storage cell.

4. The reference system delivers reference information which is responsive to sample and hold, thermal, process, layout and voltage related conditions from two widely separated regions on the chip, i.e., far left side and far right side. Thus the reference system comprehends large areas of a chip and optimizes precision and small area consumption.

5. Cells within the reference columns mimic both the "up" and "down" orientations of the cell layouts and of process conditions such as misalignments which are orientation dependant. The up and down orientations are associated with alternating rows in the array. This feature contributes to the precision of the reference system.

6. The column pair on each side of the chip records reference information that is responsive to "left handed and right handed" orientations of the sample and hold circuits in the dual plurality of sample and hold circuits. This is useful because the leakage of the sample and hold circuits may depend somewhat on the left or right handedness of the sample and hold storage node layout. This feature contributes to reference precision.

7. The extreme right side and extreme left side of the column layout is such that the end columns are additional columns which will cause the reference columns to be physically bordered on their immediate right and left sides by a regular column layout. This configuration results in reference cells and column local geometries that more closely mimic the actual cells in the storage array when fabricated in the wafer factory. This closer mimicry results in more precise reference action from the reference cells and columns.

8. The reference cells and columns have exactly the same layout and process thickness geometries and other processing steps as do the memory array cells. This configuration contributes to the precision of the reference system.

9. The cells and columns have exactly the same record and playback circuitry and biasing as do the memory cells and columns. Operational mimicry is not always the case in other memory systems. The exact mimicry in the present invention contributes to reference precision.

10. The cells are of the floating gate EEPROM type, providing a nonvolatile record, playback and erase capability, though the cells can also be of the EPROM type.

11. The cells can also be of the so called FLASH EPROM or FLASH EEPROM type construction.

12. The reference system of the present invention is useful in applications for high fidelity sound recording and playback, such as voice, music, tone, and vibration.

13. This reference system when used in conjunction with a nonvolatile analog storage array can be used to store "DC" information, not just "AC" information. The nonvolatile storage is in fact intrinsically "DC" storage.

14. The reference system when used in conjunction with a nonvolatile analog storage array can be used to store information other than sound information such as, acceleration, deformation, motion, pressure, temperature, medical information such as ECG data and blood pressure and such information as seismic data and geophysical data related to natural resource exploration such as oil and gas exploration.

15. The reference system when used in conjunction with a nonvolatile analog storage array can be used to store information other sound information such as acceleration, deformation, motion, pressure, temperature, medical information such as ECG data and blood pressure and such information as seismic data and geophysical data related to natural resource exploration such as oil and gas exploration. Further applications are expected to include spectra recording such as for gas chromatography, video spectra, and energy spectra. Applications are also expected to include video picture recording.

16. The reference system when used in conjunction with a nonvolatile storage array is useful for storing digital information where the digital information are encoded as multiple analog voltage levels, which levels when played back or read are difference values between analog reference values and analog memory array values.

While the preferred embodiment of the present invention has been disclosed and described herein, it will be obvious to those skilled in the art that various changes in form and detail may be made therein without departing from the spirit and scope thereof.

I claim:

1. A reference system for an integrated circuit analog recording and playback device having an array of columns and rows of analog signal sample storage cells wherein a plurality of samples of an analog signal are temporarily held in sample and hold circuits distributed across the array and then parallel loaded into a plurality of sample storage cells of the array comprising:

at least one column of reference storage cells at each side of the array of analog signal sample storage cells;

a sample and hold circuit coupled to each column of reference storage cells;

reference means for generating a fixed reference voltage;

means for causing a reference voltage to be sampled by a respective sample and hold circuit coupled to a column of reference storage cells whenever the adjacent sample and hold circuit samples the analog signal for subsequent storage in a sample storage cell;

means for causing the sampled reference voltage held in a sample and hold circuit coupled to a column of reference storage cells to be written into a reference storage cell of a particular cell row when the signal sample held in the adjacent sample and hold circuit is written into a storage cell of the corresponding row of analog signal sample storage cells of the array;

means for causing the sampled reference voltages stored in the reference storage cells to be read from the reference storage cells of a particular cell row when a signal sample stored in any signal storage cell of the corresponding row of analog signal sample storage cells of the array is read out of the array;

means for providing cell reference voltages from the reference voltages read from the reference storage cells each cell reference voltage corresponding to the position along a row of the signal storage cell currently being read; and, means for taking the difference between the signal sample read out of a cell of the array and the respective cell reference voltage.

2. The reference system of claim 1 having a plurality of sample and hold circuits, each being coupled to a plurality of columns of analog signal sample storage cells through a multiplexer, whereby a sample and hold circuit is coupled to each column of reference storage cells at different times dependent on the state of the multiplexer.

3. The reference system of claim 1 wherein said means for providing a cell reference voltage by combining the reference voltages read from the reference storage cells with a relative weighting dependent upon the position along a row of the signal storage cell currently being read comprises:

(a) a resistor having one end connected to the sampled reference voltage read from the reference storage cell at one side of a particular cell row of the array and the other end connected to the sampled reference voltage read from the reference storage cell at other side of a particular cell row of the array; and, (b) means for tapping the voltage from positions along said resistor in proportion to the relative position along a cell row of the signal storage cell currently being read.

4. A method of storing an analog signal in an array of columns and rows of integrated circuit signal storage cells wherein an analog signal is periodically sampled and each sample held in a sample and hold circuit until a predetermined number of samples have accumulated, and then the predetermined number of samples taken and held is written into a row of the memory array, comprising the steps of:

(a) providing a reference voltage;

(b) providing for each row of integrated circuit signal storage cells, a first and second integrated circuit reference storage cells;

(c) sampling and holding the reference voltage in a first reference voltage sample and hold circuit when the first of the predetermined number of samples of the analog signal is taken and held in a sample and hold circuit;

(d) sampling and holding the reference voltage in a second reference voltage sample and hold circuit when the last of the predetermined number of samples of the analog signal is taken and held in a sample and hold circuit; and, (e) writing the samples of the reference voltage held in the first and second reference voltage sample and hold circuits into first and second reference voltage storage cells when the predetermined number of signal samples taken and held is written into associated signal storage cells for the respective row of the memory array.

5. The method of claim 4 further comprised of the steps of:

(f) reading the sampled reference voltages stored in the reference storage cells from the reference storage cells of a particular cell row when a signal sample stored in any signal storage cell of the corresponding row of analog signal sample storage cells of the array is read out of the array;

(g) determining cell reference voltages from the reference storage cells, each cell reference voltage corresponding to the relative time the respective signal sample was taken and held in comparison to the times the respective reference voltage samples were taken and held; and;

(h) taking the difference between the signal sample read out of a cell of the array and the respective cell reference voltage to provide a signal sample output.

6. The method of claim 5 wherein the first and second reference voltage storage cells are disposed in columns along the left side and right side of the array, respectively, substantially as an extension of the array.

7. The method of claim 5 wherein the reference voltage storage cells are substantially the same as the signal storage cells and the reference voltage sample and hold circuits are substantially the same as the signal sample and hold circuits.

8. The method of claim 7 further comprised of additional storage cells disposed in columns along the left side and right side of the first and second reference voltage storage cells, respectively, also substantially as an extension of the array.

* * * * *